United States Patent [19]

Boyer

[11] 3,732,898

[45] May 15, 1973

[54] BENDING APPARATUS FOR MULTIPLE WIRE-LIKE ARTICLES

[75] Inventor: Albert E. Boyer, Peabody, Mass.

[73] Assignee: Western Electric Company, Incorporated, New York, N.Y.

[22] Filed: Oct. 6, 1971

[21] Appl. No.: 186,831

[52] U.S. Cl. ....................140/105, 29/203 B, 72/465

[51] Int. Cl. ....................B21f 1/00

[58] Field of Search ....................140/93, 105, 113; 29/203 B; 72/382, 465; 227/155

[56] References Cited

UNITED STATES PATENTS

| | | | |
|---|---|---|---|
| 2,424,717 | 7/1947 | Spiller et al. | 227/155 |
| 3,508,315 | 4/1970 | Koffken | 29/203 |
| 3,621,554 | 11/1971 | Feldman et al. | 29/203 |
| 3,515,175 | 6/1970 | Hudson | 140/105 |

*Primary Examiner*—Lowell A. Larson

*Attorney*—W M. Kain et al.

[57] ABSTRACT

An array of leads extending from diverse electrical components mounted on a printed circuit board are bent simultaneously by an apparatus which advances the board to engage the leads with an array of dies and punches. The dies are formed in a spring biased plate by bores each of which has a bevelled ramp adjacent thereto. As the board advances, the leads engage the bevelled ramp and are bent partially in predetermined directions. The punches are aligned with the bores and engage the leads to permanently crimp the leads to the board upon movement of the plate over the punches as the board continues to advance.

12 Claims, 7 Drawing Figures

INVENTOR
A. E. BOYER
By J. A. Moses
ATTORNEY

BENDING APPARATUS FOR MULTIPLE WIRE-LIKE ARTICLES

BACKGROUND OF THE INVENTION

1. Field of the Invention

This invention relates to apparatus for bending multiple wire-like articles and more particularly to apparatus for bending leads extending through a support substrate in various spaced arrays from different types of components so that the leads are extended in various diverse directions and are crimped to the substrate.

2. Description of the Prior Art

In the manufacture of electrical circuits, it is often necessary to mechanically secure and electrically connect numerous electrical components to printed circuit boards or thin film substrates. Generally, the components have leads extending therefrom which are inserted through holes in the printed circuit board and are then crimped or bent to both mechanically secure the components to the board and to position the leads in engagement with the printed circuit so that upon subsequent soldering electrical connections are formed with a circuit pattern on the underside of the board.

Heretofore, when components of diverse size and shape were mounted on printed circuit boards, the leads were crimped manually with a hand tool since existing automatic crimping machines are generally unable to accommodate various sizes and shapes. Ordinarily, a large number of identical boards having the same component configuration are produced during one production run. In this procedure, manual crimping of each lead not only hinders product output, but is tedious and expensive, often resulting in high product discard due to human error and non-uniform crimping.

Another problem resides in crimping the leads in various diverse directions in order to establish electrical connections between the leads extending from the components and adjacent land areas of the printed circuit.

There are many prior art methods of and apparatus for crimping leads; however, the prior art approaches are generally limited to crimping the leads of one type of component or one shape of component in the same or opposite direction. After crimping the leads of one shape or type of component to the board, difficulty is usually encountered when moving the board to a subsequent machine where the leads of a different component are to be crimped simply because the different shapes may mechanically interfer with the operation of the subsequent machine. Furthermore, when the leads are to be crimped in many different directions, it is necessary to manually crimp the leads. Of course, several separate machines probably can be designed to accommodate various size components and lead crimping situations, however, this obviously can be very expensive. Therefore, the aforementioned manual crimping is usually resorted to with all of its attendant problems.

SUMMARY OF THE INVENTION

It is, therefore, an object of the invention to provide new and improved apparatus for bending wire-like articles.

Another object of this invention is to provide new and improved apparatus for bending simultaneously a plurality of wire-like articles in different predetermined directions.

STill another object of this invention is to provide new and improved apparatus for directing the bend of a wire-like article in a predetermined direction.

A further object of this invention is to provide new and improved apparatus for bending in diverse directions a plurality of leads extending from electrical components through a printed circuit board to connect the leads electrically to circuit paths on the board while securing the components to the board.

The present invention contemplates apparatus for bending a wire-like article, or the like, wherein one end of the wire-like article is moved into engagement with a first surface which initially bends the wire in a selected direction. The wire is then moved into engagement with another surface which further and finally bends the wire.

The present invention may include a spring-urged, movable plate having a series of bores therethrough adjacent to each of which is a bevelled ramp disposed to bend a wire-like article in a predetermined direction. The invention may further include a series of punches or dies wherein each punch is aligned with one of the bores to further bend the wire-like member upon depressing the plate to bring the wire-like members into engagement with the punches.

DETAILED DESCRIPTION

Figures 1, 3:
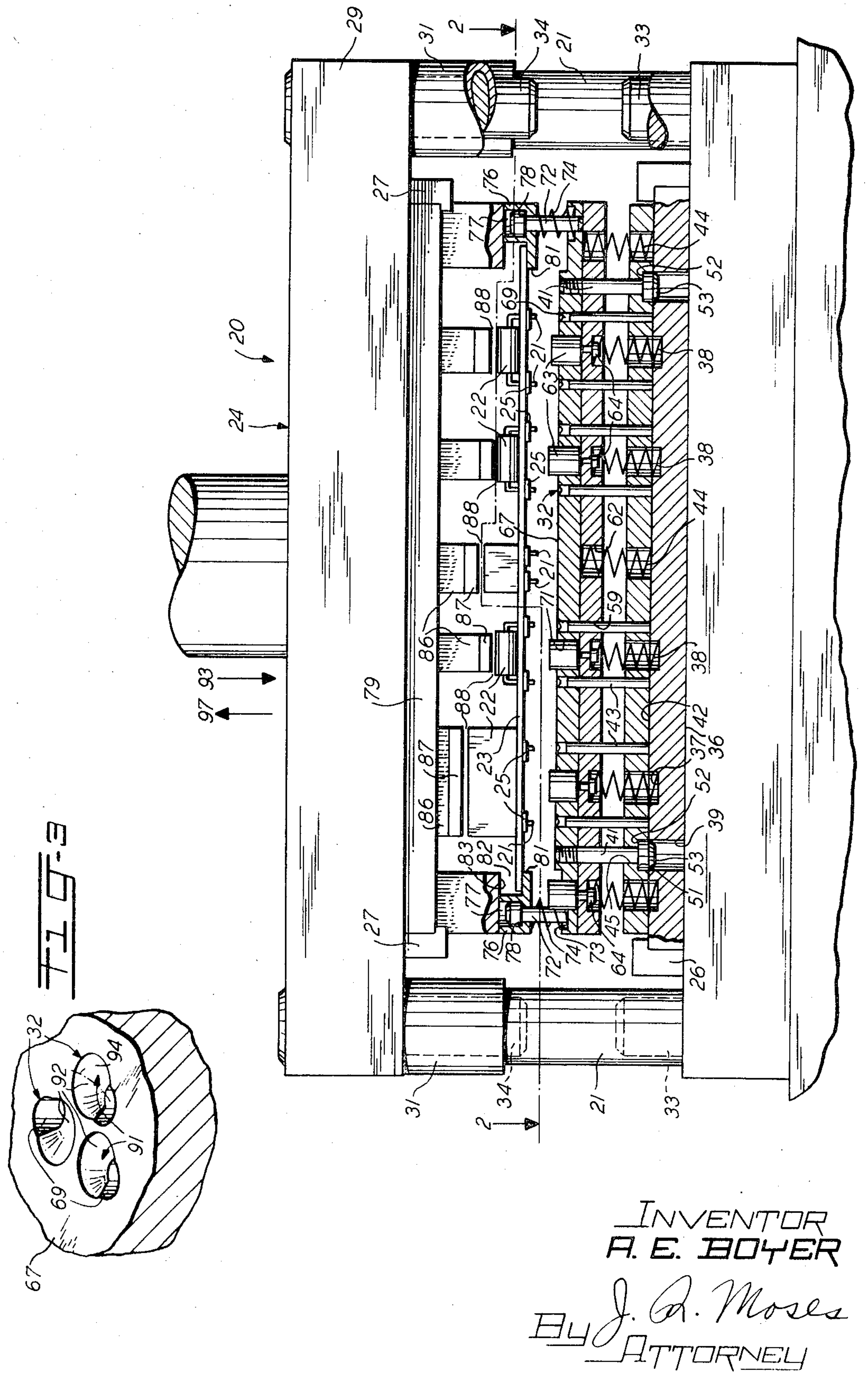
FIG. 1 is a sectional view of a lead-bending apparatus in accordance with the present invention showing a printed circuit board mounting an array of diverse components having leads projecting through the board for subsequent crimping to the board.
FIG. 3 is an isometric view showing an array of three dies for bending leads of a component in three directions.
Figure 2:
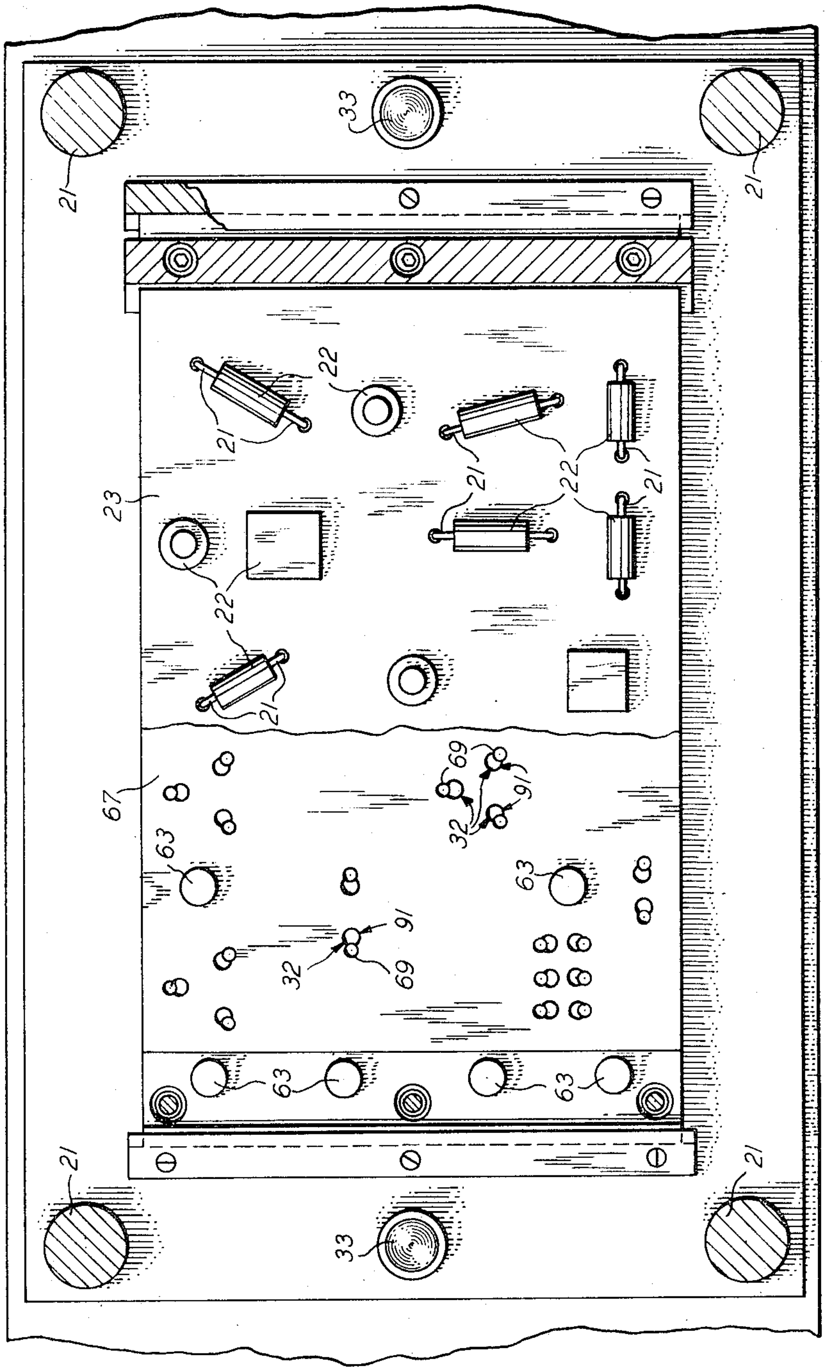
FIG. 2 is a sectional view of the apparatus of FIG. 1 taken along lines 2-2 and showing a portion of the array of components mounted on the printed circuit board and a portion of an array of dies used in crimping the leads of the components.

Referring now to FIGS. 1 and 2, there is shown a multiple bending apparatus, designated generally by the numeral 20, for mass of crimping leads 21, extending from a diverse array of electrical components 22, into engagement with conductive pads 25 of a circuit (not shown) on the underside of a printed circuit board 23.

The components 22 may be of various sizes, shapes and heights and may be oriented in various directions to conveniently register the leads 21 with the circuit paths on the underside of the board 23. The leads 21 project through holes 24 in the boards 23 and are subsequently bent by the apparatus 20 into engagement with the pads 25 to form electrical connections between the leads and the pads and to mechanically secure the components 22 to the board. In order to connect with circuit paths of diverse orientations, the leads must be bent by the apparatus 20 in many diverse directions.

The multiple crimping apparatus 20 may be actuated by a conventional hydraulicly controlled ram or the like, designated generally by the number 24, and to which the apparatus is secured by a series of bottom and top clamps 26 and 27, respectively. The hydraulic ram 24 has a stationary bed 28 and a press 29 which reciprocates on four guide rods 31 to advance the printed circuit board 23 and the leads 21 extending therefrom into engagement with an array of diversely oriented dies, designated generally by the numerals 32. A stop 33 projects from the bed 28 and engages a corresponding stop 34 extending from the press 29 to positively limit downward motion of the press and thereby prevent the press from crushing the printed circuit board 23.

The bending apparatus 20 is composed of a series of plates and associated springs arranged in a cascade for sliding movement in sequence upon operation of the hydraulic ram 24. Referring mainly to FIG. 1, a base plate 36 is clamped to the stationary bed 28 of the hydraulic ram 24 by the bottom clamps 26. The base plate 36 has a series of recesses 37. In each recess 37 is seated one of a first series of coil springs 38. The base plate 36 also has a series of bores 39, two of which are shown extending therethrough to accommodate vertical reciprocal motion of a series of bolts 41. In addition, the base plate 36 has a surface 42 against which a series of circular stationary dies or punches 43 and a second series of coil springs 44 abut.

Resting on the base plate 36 is a support plate 46 which is bored to receive the first and second series of springs 38 and 44 and the punches 43 within a series of bores 47, 48, and 49, respectively. The support plate 46 also has a series of bores 45 that guide the bolts 41 and limit upward motion of the bolts with shoulders 51 which engage top surfaces 52 of heads 53 on the bolts.

The first series of coil springs 38 are seated with their top ends within recesses 56 formed in a retainer plate 58 to hold the retainer plate spaced from the support plate 46 while biasing the retainer plate upwardly and away from the support plate. The retainer plate 58 has a series of bores 59, 61 and 62 extending therethrough, through which pass the punches 43, the shanks of the bolts 41 and the second coil springs 44, respectively, allowing the retainer plate to reciprocate relative to the support plate 46. A series of buttons 63 are attached rigidly to the retainer plate 58 by screws 64 mounted through the recesses 56. The buttons 63 engage the underside of the printed circuit board 23 to support the board beneath the components 22 having the leads 21 which are to be crimped.

Abutting the retainer plate 58 is a die plate 67 which is biased upwardly both by the spring-urged retainer plate 58 and the second series of coil springs 44 which act independently of the retainer plate. The bolts 41 are threaded directly into the die plate 67 and serve to limit upward motion of the die plate by the engagement of the bolt heads 53 with the shoulders 51. This allows the die plate 67 to float within the bending apparatus 20 due to the bias of the springs 44 and 38. The punches 43 and buttons 63 are slidably positioned within through bores 69 and 71, respectively of die plate 67 so that the die plate can reciprocate relative to the punches and so that the buttons can pass through the die plate upon being pushed from above. Upon depressing the die plate 67, the springs 44 compress, and the bolts 41 move downwardly within the bores 39 in the base plate 36.

Threaded into die plate 67 and centered in the recesses 73 are a series of bolts 72. Coil springs 74 surround the bolts 72 and support a pair of shelf brackets 76 which float thereupon between the die plate 67 and the press 29. The shanks of the bolts 72 pass through bores 77 into the shelf brackets 76 while shoulders 78 within the bores 77 retain the heads of the bolts. Integral with and projecting from the shelf brackets 76 are a pair of shelves 81 upon which the printed circuit board 23 rests. There is a gap 82 between the top of the printed circuit board 23 and a shoulder 83 projecting above each of the shelves 81 to allow loading of the board 23 without interference. Aligned with and positioned above each of the components 22 are pads 86 which have resilient cushions 87 thereon. Between each component 22 and its associated cushion 87 there are equal gaps 88 so that when the pads 86 are advanced toward the components, the cushions engage the components simultaneously.

Referring to FIGS. 2 and 3 where the dies 32 are shown in detail, each die has a funnel-shaped, bevelled ramp designated generally by the numeral 91 formed by a circular depression in the plate 67 which intersects a through bore 69. The bevelled ramp 91 may have a concave spherical or concave conical surface 92 which funnels toward the through bore 69 and intersects the through bore along a line 93 preferably passing through the nadir of the surface. Generally, the circumference of the bevelled ramp 91 is greater than that of the through bore 69 and the average slope of the surface 92 relative to the top surface of the die plate 67 is about 60°.

Initial bending of one of the leads 21 is accomplished when the lead is advanced into contact with and along the surface 92. It is generally desirable to initially engage the surface 92 along a line 94 which passes through both the central axis of the through bore 69 and an axis 95 which is perpendicular to the surface of the die plate 67 and contains the center of generation for the surface 92; in other words, along a line which will direct the lead 21 into the through bore 69.

Generally, the lead 21 follows the path of least resistance when being advanced along the surface 92 bending its free end portion in the direction of that path. Since the surface 92 generally slopes toward the line 94, the lead 21 bends least for each increment of advance along the line and therefore tends to follow the line 94 as the path of least resistance. The line 94 generally forms the path of least resistance because the lead 21 encounters a greater slope if it moves off the line since additional bending components having an upward direction then act upon the lead. Accordingly, the direction of the line 94 determines the direction in which the lead 21 bends. Therefore, the direction in which the lead is bent may be predetermined by orienting the bevelled ramp 91 at a predetermined position relative to the circumference of the through bore 69. By orienting the various bevelled ramps 91 in various positions relative to the circumferences of the through bores 69, the leads 21 can be bent in any direction desired.

After the leads 21 are initially bent in a predetermined direction by engaging the bevelled ramps 91 and are directed into the through bores 69, they engage the top surface of the punches 43 which firmly crimp the leads into engagement with the pads 25 on the printed circuit board 23, as explained hereinafter.

It is necessary to bend the leads 21 in various directions in order to insure proper contact with the pads 25

(FIG. 1) of the circuit on the underside of the printed circuit board 23. The pads 25 branch out in various directions in order to connect various portions of the associated circuit (not shown) and to avoid mechanical interferences.

The dies 32 are arranged in arrays to conform to the configuration of the leads 21 on the particular component 22 being secured. For example, a transistor can, having three leads 21 would be stationed in alignment with an array of three dies 32 each having bevelled ramps 91 disposed to direct the leads in predetermined directions. Furthermore, the pads 25 do not necessarily symmetrically surround the holes in the bore 23 through which the leads 21 project but rather bulge further in one direction than another so that the leads upon being bent in the direction of the bulge engage a relatively large area of the circuit path thereby achieving a greater degree of contact.

OPERATION

Operation of the multiple bending apparatus 20 is dependent upon the cascade arrangement of the shelf brackets 76, the plates 67 and 58, and springs 74, 44 and 38. The springs 74, 44 and 38 are arranged in an ascending order of stiffness, wherein the springs 74 are the weakest springs and therefore are the first to compress. The springs 38 are slightly stronger than springs 74 and therefore will compress only after springs 74 have been compressed. The springs 44 are stronger than both the springs 38 and 74 and compress only after the springs 38 and 74 have been compressed. By programming the compression of the springs 74, 44 and 38 in this manner, the shelf bracket 76 and the plates 67 and 58 are programmed to move in sequence. This same result may be accomplished using springs of identical stiffness by having more of the springs 44 than the springs 38 and having more of the springs 38 than the springs 74.

Figure 4:
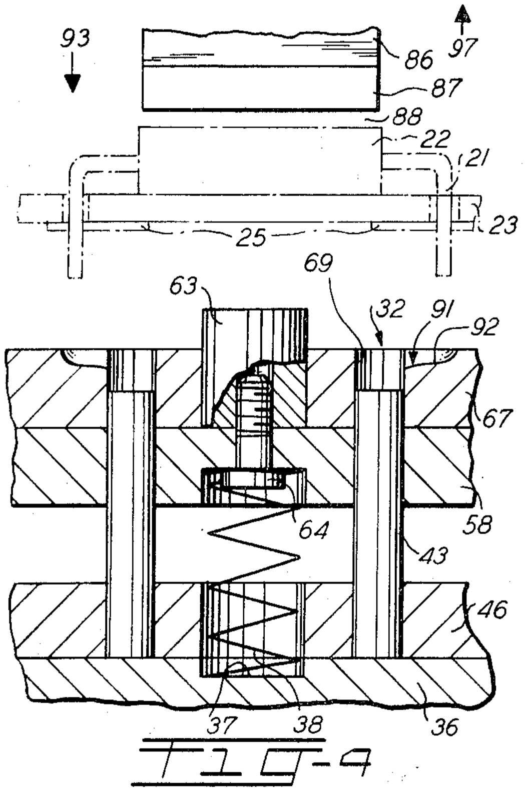
FIGS. 4–7 are sectional views of an enlarged portion of FIG. 1 showing how the leads of one component are bent into engagement with the printed circuit board during a progression of steps.

Referring now to FIG. 1, the printed circuit board 23 with the components 22 mounted thereon, but with the leads 21 not as yet crimped, is moved laterally into the bending apparatus 20 to a rest position upon the shelves 81. The hydraulic ram 24 then lowers or advances the press 29 in the direction of arrow 93 toward the stationary bed 28 as shown in FIGS. 1 and 4 bringing the cushions 87 into engagement with the components 22 to clamp the board between the cushions and the shelves 81. The shelf brackets 76 then push against the bias of the springs 74 compressing the springs while the heads of the bolts 72 slide upwardly into the bores 77 as the brackets move downwardly.

Figure 5:
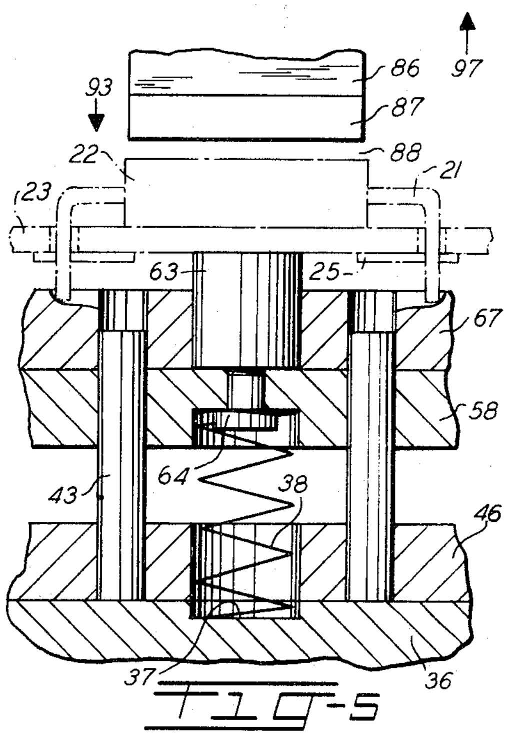

As the hydraulic ram 24 continues to move in the direction of the arrow 93, the printed circuit board 23 engages the series of buttons 63 as shown in FIG. 5 whereupon the cushions 87 begin pressing the printed circuit board 23 against the buttons causing the buttons to slide within the bores 71 of the die plate 67. As the buttons 63 slide within the bores 71, they push the retainer plate 58 downwardly thereby compressing the coil springs 38. The shelves 81 then move into releived portions 96 (FIG. 1) on the die plate 67 and the springs 74 compress within the recesses 73 so that the printed circuit board 23 will rest flat against the die plate 67 as shown in FIG. 6.

Figure 6:
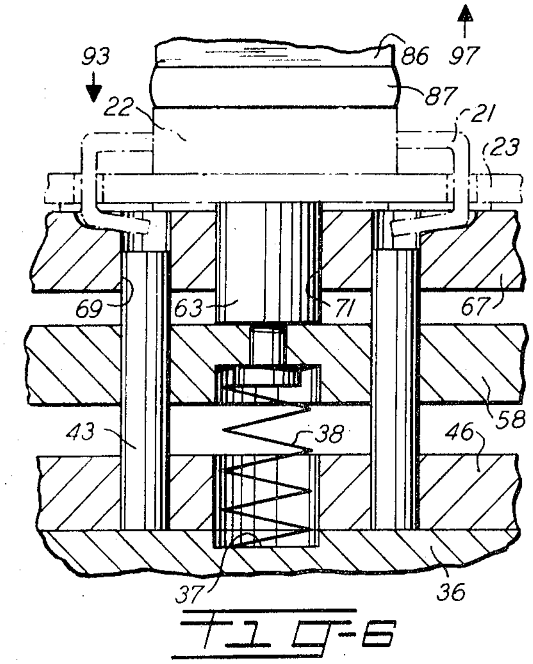

As the buttons 63 move downwardly, the leads 21 are pushed into engagement with the bevelled ramps 91 and bent from the position seen in FIG. 5 to the position seen in FIG. 6, where they are adjacent to and ready for engagement by the upper end surfaces of the punches 43. As previously explained, the direction in which each lead 21 is initially bent is determined by the orientation of the through bores 69 with respect to the bevelled ramps 91.

Figure 7:
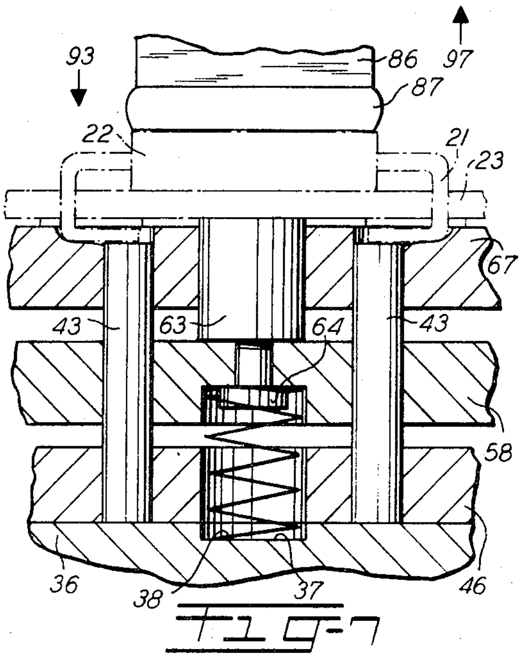

When the bending apparatus 20 is in the position illustrated in FIG. 6, the buttons 63 are flush with the top surface of the die plate 67 so that as the hydraulic ram 24 continues to push the press 29 downwardly in the direction of the arrow 93, the printed circuit board 23 pushes directly against the die plate. The bolts 41 which are rigidly threaded to the die plate 67 then slide downwardly within the bores 39 of the base plate 36 allowing the die plate to move downwardly. This causes the apparatus 20 to move from the condition of FIG. 6 to the condition of FIG. 7, wherein the through bores 69 of the die plate 67 slide down over the punches 43 bringing the leads 21 into engagement with the top surfaces of the punches 43 so as to further bend or crimp the leads 21 into engagement with the pads 25 of the circuit on the underside of the printed circuit board 23 thereby securing the components 22 to the board and making electrical contact with the circuit.

After the crimps have been formed, the hydraulic ram 24 is deenergized and moves upwardly in a direction of the arrow 97. This releases pressure on the various springs 38, 44 and 74 allowing the aprings to return the apparatus 20 from the condition of FIG. 7 to the condition of FIG. 1 where the printed circuit board 23 with the crimped leads 21 can be laterally slid from the shelf 81 for use or for further processing.

What is claimed is:

1. An apparatus for bending a projection extending from an article comprising:

means for slidably receiving the article to initially position the article for subsequent bending of the projection;

means for advancing the article after the article has been positioned;

means for arresting motion of the article after the article has been advanced a predetermined distance;

means on said advancing means for engaging said article after the motion of the article has been arrested to press said article against said motion arresting means and clamp said article between said engaging means and said motion arresting means;

means for allowing movement of said motion arresting means in response to pressure from said article;

means for bending initially the projection upon movement of said motion arresting means, said initial bending means being in the path of advancement of and being engagable by said article;

means allowing movement of said initial bending means in response to engagement by and advancement of said article; and means engagable with the projection upon movement of said initial bending means for finally bending the projection as the article continues to advance.

2. The apparatus of claim 1 wherein the means for arresting motion of the article is a member having projections thereon passing through bores in the initial bending means to engage the article.

3. The apparatus of claim 1 wherein said means allowing movement of said arresting means is a first spring means and wherein said means allowing movement of said initial bending means is a second spring means which is stronger than said first spring means and does not flex until said first spring means is substantially collapsed.

4. The apparatus of claim 1 wherein said means allowing movement of said arresting means is a first plurality of springs and wherein said means allowing movement of said initial bending means is a second plurality of springs greater in number than said first plurality of springs and not compressable until said first plurality has substantially collapsed.

5. The apparatus of claim 1 wherein said initial bending means is a bevelled ramp in a plate and wherein said final bending means is a punch initially spaced from said bevelled ramp and aligned with a bore adjacent to said bevelled ramp for relative movement through said bore.

6. Apparatus for bending simultaneously a plurality of wires projecting from an article, which comprises:

means for advancing the article;

means arresting motion of the article after the article has been advanced a predetermined distance;

means on said advancing means for engaging said article after the motion of the article has been arrested to press said article against said motion arresting means and to clamp said article between said engaging means and said motion arresting means;

means allowing movement of said motion arresting means in response to pressure from said article;

means for initially bending the wires upon movement of said motion arresting means, said initial bending means being in the path of advancement of and being engagable by said article;

means allowing movement of said initial bending means in response to engagement by and advancement of said article; and means exposed by movement of said initial bending means for finally bending the wires upon continued advancment of the article.

7. Apparatus for bending simultaneously a plurality of wires extending through a printed circuit board from an array of diverse components mounted on the board, comprising:

means for receiving the board to initially position the board;

means for advancing the board after the board has been positioned;

means for arresting motion of the board after the board has been advanced a predetermined distance;

means on said advancing means for engaging the components after the motion of the board has been arrested to press said board against said motion arresting means and to clamp said board between said engaging means and said motion arresting means;

means for allowing movement of said motion arresting means in response to pressure from said board;

means for initially bending the wires upon movement of said motion arresting means, said initial bending means being in the path of advancement of and being engagable by said board;

means for allowing movement of said initial bending means in response to engagement by and advancement of said board; and means engagable upon movement of said initial bending means for finally bending the wires upon continued advancement of the board to secure and electrically connect the wires to the board.

8. The apparatus of claim 7 wherein the means for engaging the components after the motion of the board has been arrested includes a pad for each component wherein the pads are equally spaced from associated components prior to engaging the components to insure substantially uniform pressure over the board upon subsequent engagement of the components.

9. The apparatus of claim 8 wherein each pad has a resilient cushion mounted thereon for engaging the associated component.

10. In an apparatus for performing a sequence of bending operations on an elongated member, a sequencing mechanism including:

three movable members arranged in tandem fashion;

first spring means for urging the first of said members in a first direction;

second spring means for independently urging the second of said members in the first direction;

third spring means extending between the second and third of said members for urging the second member into engagement with the first member; and means for compressing said first spring means prior to compressing said second spring means and subsequent to compressing said third spring means when said third member moves in a direction opposite said first direction to sequentially move said members.

11. The apparatus of claim 10 wherein the first and second members are plates and wherein the first member has a projection thereon which passes through a bore in the second member and a bore therethrough which said second spring passes to abut said second member.

12. The apparatus of claim 10 further including means rigidly secured to the second member and slidably related to the first member for positively limiting movement of said first and second members in said first direction.

* * * * *

UNITED STATES PATENT OFFICE
CERTIFICATE OF CORRECTION

Patent No. 3,732,898 Dated May 15, 1973

Inventor(s) Albert E. Boyer

It is certified that error appears in the above-identified patent and that said Letters Patent are hereby corrected as shown below:

Column 2, line 1, cancel "STill" and insert --Still--.

Column 8, line 54, insert the following claim:

--13. Apparatus for bending the end portion of a wire projecting from a component comprising:

means for holding the wire;

means for moving the holding means to advance the wire;

a die with a bevelled ramp positioned in the path of advancement of the wire for initially bending the end portion of the wire;

a bore extending through the die adjacent to the bevelled portion for receiving the end portion of the wire after the wire has been bent;

a punch positioned normally within a portion of said bore other than that portion which receives the portion of the bent wire for subsequently engaging the end of the bent wire as the wire is advanced; and means for allowing displacement of said die after the wire is initially bent to allow the bore to slide over the stationary punch and engage the end of the wire with the punch to clinch the wire to the component.--

Signed and sealed this 27th day of November 1973.

(SEAL)
Attest:

EDWARD M.FLETCHER,JR.
Attesting Officer

RENE D. TEGTMEYER
Acting Commissioner of Patents